United States Patent [19]
Buker et al.

[11] Patent Number: 5,980,647
[45] Date of Patent: Nov. 9, 1999

[54] METAL REMOVAL CLEANING PROCESS AND APPARATUS

[75] Inventors: Edward D. Buker, Underhill Center; Edward W. Conrad, Jefforsonville; James M. Leas, South Burlington, all of Vt.

[73] Assignee: International Business Machines Corporation, Armonk, N.Y.

[21] Appl. No.: 08/893,945

[22] Filed: Jul. 15, 1997

[51] Int. Cl.⁶ .................................................. B08B 7/04
[52] U.S. Cl. ........................ 134/33; 134/6; 134/34; 134/153
[58] Field of Search ................ 134/33, 52, 86

[56] References Cited

U.S. PATENT DOCUMENTS

| | | | |
|---|---|---|---|
| 3,778,626 | 12/1973 | Robertson | 250/492 |
| 3,968,598 | 7/1976 | Ogawa | 51/55 |
| 4,234,797 | 11/1980 | Ryding | 250/492 |
| 4,326,553 | 4/1982 | Hall | 134/153 |
| 4,775,796 | 10/1988 | Purser et al. | 250/492.2 |
| 5,177,908 | 1/1993 | Tuttle | 51/283 |
| 5,279,704 | 1/1994 | Saito | 156/640 |
| 5,368,054 | 11/1994 | Koretsky et al. | 134/153 |
| 5,421,769 | 6/1995 | Schultz et al. | 451/278 |
| 5,486,702 | 1/1996 | O'Connor et al. | 250/492.21 |

*Primary Examiner*—Jill Warden
*Assistant Examiner*—Yolanda E. Wilkins
*Attorney, Agent, or Firm*—Richard M. Kotulak

[57] ABSTRACT

A megasonic liquid stream semiconductor wafer cleaning apparatus and method uniformly removes debris from all points on the surface of a semiconductor wafer. The wafer is rotated about a proscribed axis while the means for producing focused megasonic waves and a liquid stream of cleaning fluid is focused on the wafer so as to apply sufficient energy to clean the wafer yet not cause damage to the electronic circuity embedded in the wafer. A method is provided for moving the outlet port providing the stream of megasonic cleaning fluid across the wafer so that the amount of energy applied to any area of the wafer is relatively constant.

20 Claims, 9 Drawing Sheets

FIG. 11 RELATED TO AZIMUTH OF POINT X,Y ON WAFER

FIG. 12 RELATED TO AZIMUTH OF POINT X,Y ON WAFER

FIG. 13

METAL REMOVAL CLEANING PROCESS AND APPARATUS

BACKGROUND OF THE INVENTION

1. Field of the Invention

The present invention generally relates to semiconductor cleaning apparatus, and more particularly, to a megasonic liquid stream cleaning apparatus for cleaning metal wiring patterns.

2. Discussion of the Related Art

During the manufacture of semiconductor devices there are many stages that require cleaning of a silicon wafer or other microelectric workpiece. This is especially true during what is known as back end of the line processing where the interconnect wiring for the circuits are fabricated. It is important to remove any metal debris created by fabrication or testing steps since metal debris can lead to shorts which will cause yield or reliability problems.

One method for cleaning microelectronic wafers is to use a high pressure vertically directed water liquid stream incident on a rotating wafer below. The wafer is disposed in a plane which is at right angles to the incident liquid stream. The nozzle of the liquid stream is attached to a reciprocating arm so that the entire wafer can be accessed. Often, the high pressure within the water column causes damage to metal patterns on the wafers, particularly when thin metal wiring is subjected to the liquid stream. A mathematical analysis of the forces exerted by the conventional spin-clean device indicates very large horizontal forces in the region of the boundary layer of the liquid stream. These forces are at times strong enough to destroy the metallurgy since typical circuit lines are vulnerable to shear forces.

Another spin-clean device operates at a significantly lower hydrostatic pressure and does not rely on shear forces to obtain effective cleaning of the microelectronic boards or wafers. The high pressure water column is replaced by a low pressure liquid stream with pressures below an atmosphere. At this pressure, the lateral or shear forces are reduced by at least two orders of magnitude compared to the previously described device. Sufficient water flow, however is still present to rinse away loose or loosened debris. The diameter of the liquid stream can be on the order of 6–7 mm. Megasonic energy from a focused transducer in a chamber under low hydrostatic pressure is directed into the liquid stream near the nozzle. Typically, longitudinal waves are used, generated by a shaped piezoelectric transducer. The predominant forces of the liquid stream incident on a workpiece undergoing cleaning are now in the direction of the stagnation column of the liquid stream, i.e., longitudinal or vertical instead of shear or horizontal. The acoustic energy can be as high as several hundred watts/cm$^2$. This type of acoustic liquid stream has been shown to be effective in a variety of other cleaning applications, including removal of tar, wax and other debris.

An example of such a megasonic wafer cleaning apparatus is described in commonly assigned U.S. Pat. No. 5,368,054 to Koretsky et al., incorporated herein by reference. An example of a commercial system that uses megasonic energy in the cleaning process is Dainippon Screen Manufacturing Company's SP-W813-AS Spin Processor for post CMP cleaning.

However, even with systems that rely on acoustic energy it is often difficult to provide and maintain the right amount of energy to loosen and remove the metal debris without damaging some of the delicate metal wiring lines.

SUMMARY OF THE INVENTION

Thus, an improved cleaning system is need as provided by the invention described here.

It is therefore one object of this invention to improve the operation of an megasonic, liquid stream wafer cleaning apparatus.

It is another object to optimize the control of the amount of energy applied to the surface of a semiconductor wafer within certain tolerances.

It is yet another object of this invention to provide a post wafer probe cleaning system which fully removes contamination but does not damage of any metal lines on the wafer under test.

It is yet another object of this invention to enhance yields and reliability during the semiconductor fabrication process.

According to the inventions a semiconductor wafer cleaning system is provided for removing debris as the wafer (or other workpiece) is rotated about a proscribed axis in a cleaning plane. The system comprises a housing having ports for receiving and dispensing cleaning fluid, a megasonic wave producing means, and a means for moving a housing containing the outlet port for dispensing the fluid across the wafer. The means for moving the housing across the wafer is suitably driven by a means that compensates for both the tangential and the radial velocity of the outlet port relative to the wafer to insure that all areas of the wafer receives approximately the game amount of megasonic energy. The means described herein for moving the housing across the wafer is driven by computer controlled means that provides for changing the velocity of the housing across the wafer based on where the housing is relative to the rotational axis of the wafer such that each area of the wafer receives the same amount of energy. The controller operates under the principle of having the fluid dispensing means spend the same amount of time over each point on the wafer.

BRIEF DESCRIPTION OF THE DRAWINGS

The foregoing and other teachings of the present invention will become apparent upon a detailed description of this invention as provided below. In the description to follow, reference will be made to the accompanying drawings, where like reference numerals are used to identify like features in the various views and in which.

DETAILED DESCRIPTION OF THE PREFERRED EMBODIMENTS

Figure 1:
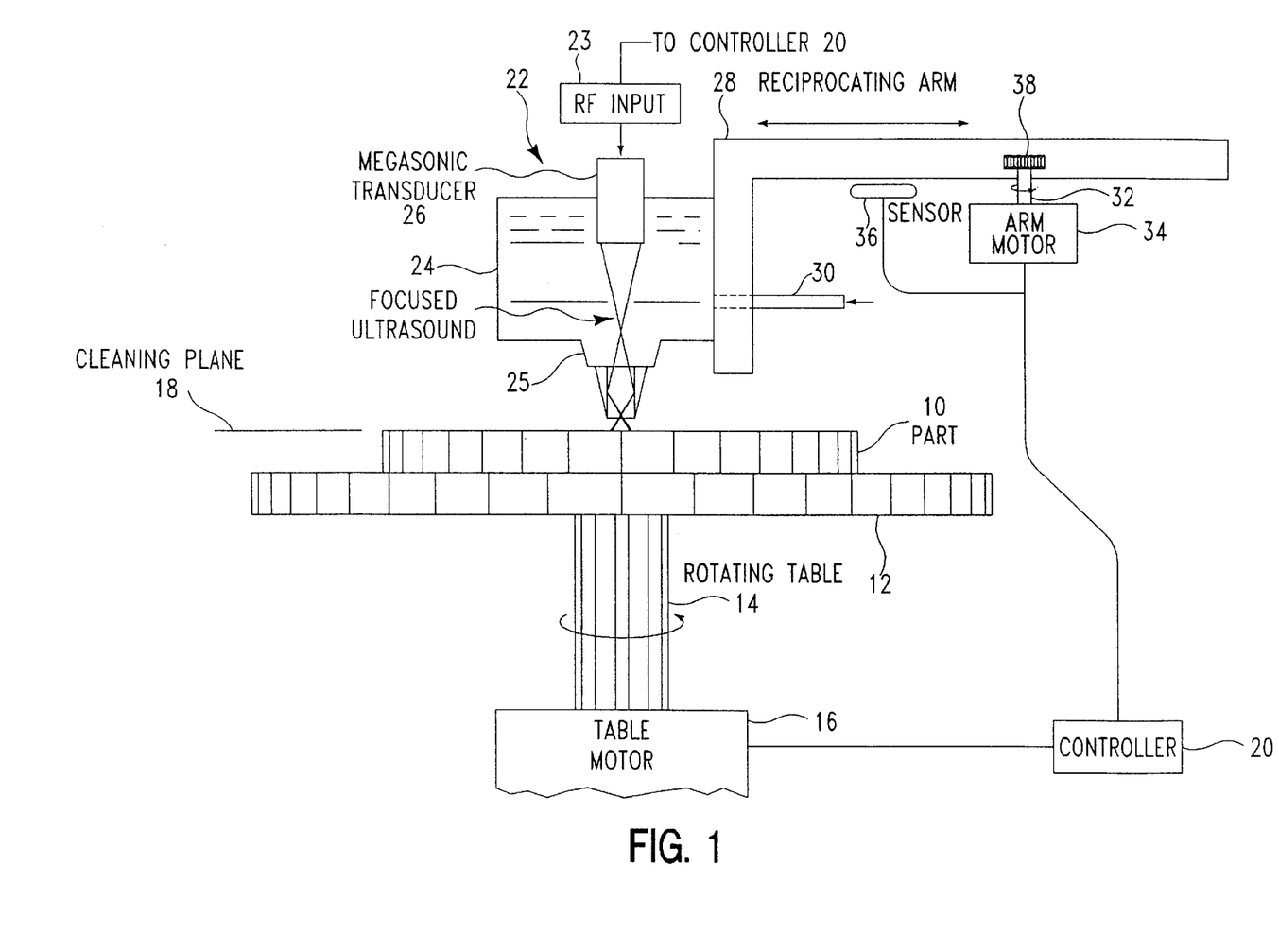
FIG. 1 is a simplified drawing of a megasonic spin-cleaning system according to this invention.

Referring to FIG. 1, there is illustrated simplified drawing of a megasonic spin-cleaning system according to the present invention. The system is designed for cleaning or removing debris from a surface of a semiconductor wafer 10 as the wafer is rotated about a prescribed axis 14 in a cleaning plane indicated by numeral 18. Wafer 10 is securably held in the cleaning plane on a rotatable vacuum chuck 12 or the like, as is well-known in the art. While the discussion that follows makes reference to the cleaning of a wafer 10, it should be noted that the cleaning system may be suitable for cleaning of other objects as well. The cleaning system includes a movable assembly 22 which comprises a housing 24, a megasonic transducer 26 for producing focused megasonic waves, and a reciprocating arm 28 for moving the assembly 22 across the wafer. Cleaning fluid such as deionized water from a pressure regulated supply (not shown) is fed into the movable assembly 22 through inlet 30. The cleaning fluid is released onto wafer 10 through outlet port 25 which contains a suitable nozzle to promote laminar flow. Typically, the walls of outlet port 25 are conically tapered to assist in the reduction of turbulent flow. A motor 16 provides rotational motion to chuck 12 and wafer 10. A commercially available example of the megasonic cleaning system is the Spin Processor SP-W813-AS offered by Dainippon Screen Manufacturing Co., Ltd., which includes a D-Sonic cleaning option which is modified to dispense a liquid stream coupled to transducer driven by RF input 23 from an RF generator at a power level of about 9 to about 31 watts.

The preferred embodiment of this invention uses a controller to achieve the proper functional relationship between the position of outlet port 25 over wafer 10 and its tangential and radial velocity relative to the wafer. Controller 20 may comprise a suitable control means such as a computer or the like, programmed for the desired operation of motor 16. Programming of a computer controller is well known in the art and therefore not discussed in detail herein. Controller 20 is also connected to sensor 36 which provides information on the radial position of arm 28 relative to axis 14, and to arm motor 34, for controlling the motion of arm 28. Controller 20 also controls RF input 23 to megasonic transducer 26 to provide acoustic energy to the cleaning fluid.

Figure 2:
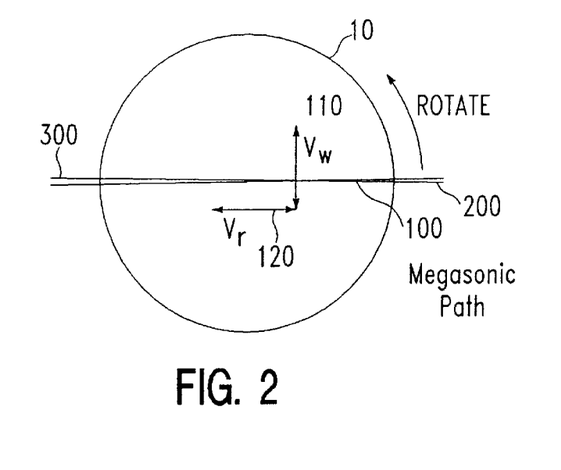
FIG. 2 illustrates the velocity vectors at work as a megasonic outlet port traverses a wafer.

FIG. 2 illustrates a top view of a possible megasonic liquid stream sweep 100 path caused by the motion of the reciprocating arm 28 across the diameter of wafer 10 from position 200 to position 300, both position 200 and 300 being outside the wafer. Typically, the length of time it takes for the outlet port to traverse a wafer is measured in seconds.

Since the wafer is rotating, the relative velocity of liquid stream and wafer at any particular point on wafer 10 has two vector components: a tangential velocity 110 due to the rotation of the wafer and a radial velocity 120 due to the movement of reciprocating arm 28, each working at right angles to the other. The relative velocity V of the outlet port to a rotating point on the wafer at any radius is provided by the vector equation $V=V_r+V_w$, where $V_r$ is the radial component and $V_w$ is the tangential component of the relative velocity at the radius.

In order to provide uniform treatment for cleaning from the edge to the center of the wafer either the relative velocity across each point (assuming one pass over each point) on wafer 10 needs to be constant or the intensity will need to be varied as a function of the relative velocity.

Figure 3:
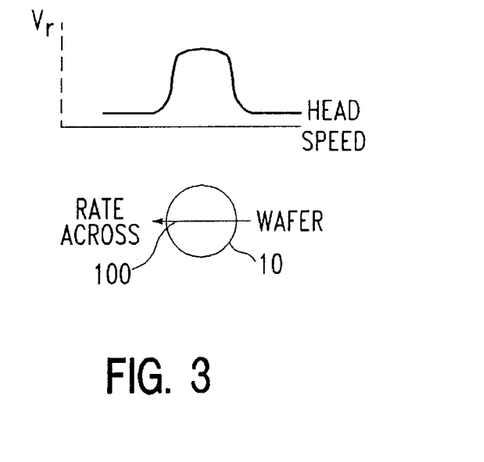
FIG. 3 is a general graphical representation of how the traverse rate will need to vary as the outlet port traverses a wafer.

The graph shown in FIG. 3 illustrates generally how the radial velocity $V_r$ will need to change as outlet port 25 moves across the wafer, presuming the wafer is spinning at a constant rate. Since typical rotational rates are often on the order of 3000 to 4000 revolutions per minute, the tangential velocity $V_w$ is the primary factor at the edge of a wafer. However, as one approaches the center of the wafer the radial velocity $V_r$ becomes a more important factor, so the outlet port will need to accelerate as it moves toward the center and then decelerate as it moves away from the center. In the simple case where the sweep path of the outlet port is along the diameter of the wafer and the acoustic liquid stream is point sized, the radial velocity $V_r$ is determined by the equation:

$$V_r = \sqrt{V^2 - \omega^2 r^2}$$

Here $\omega$ is the angular velocity and r is the distance the outlet port is from the center of the wafer. Since we want V to be constant the radial velocity $V_r$ of the outlet port will vary with radius, accelerating rapidly at the center.

The analysis becomes more complex when an outlet port 25 that produces a liquid stream as much as 7 mm in diameter is included. Also, at the high rotational speeds used for cleaning, each point on the wafer may see a number of passes of the outlet port (multiple stripes). The inventors have found that a high rotational rate reduces the effect of variations in radial position. Applicants also found that for uniform cleaning the goal is to have each point on the wafer experience the same total megasonic energy, and the total time outlet port 25 is over each point on wafer 10 must be constant (within a tolerance) In addition, they found that even though the influence of the radial velocity of the outlet port is de minimus at the edge of a wafer, the radial velocity becomes a critical factor for those chips lying in the center of the wafer.

Figure 4A:
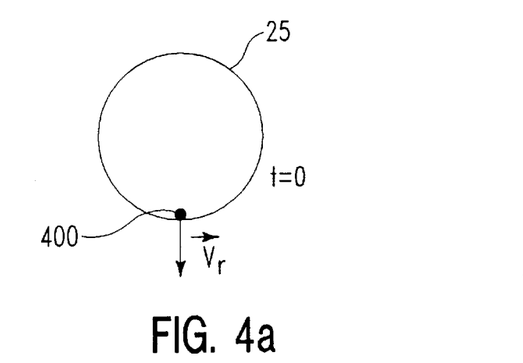
FIGS. 4a, 4b, 4c, and 4d depicts how a point on a wafer appears to an outlet port at various intervals as the outlet port traverses a rotating wafer.
Figure 4B:
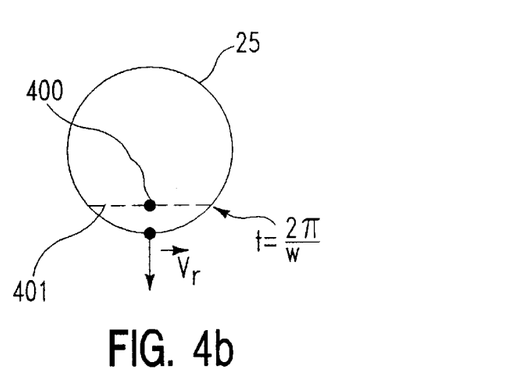
Figure 4C:
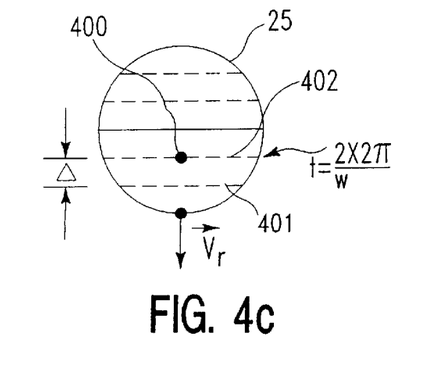

FIGS. 4a–4c illustrate the cleaning of a single point on the wafer at a relatively large radius on the wafer. At some time the outlet port 25, having a diameter 2b, is tangent to this point, as shown in FIG. 4a, where we see our point of interest 400 on wafer 10 at a time t=0 and under the liquid stream from megasonic outlet port 25 (assuming the nozzle produces a liquid stream that has the same diameter 2b as the outlet port). At a time approximately equal to the period of the wafer rotation, another portion of the liquid stream is now over that same point of interest 400 on the wafer. (This also assumes the outlet port 25 is small relative to the size of the wafer 10.) As the wafer rotates, a "stripe" is defined by the point 400 as it passes under the outlet port 25. (see path 401 in FIGS. 4b and 4c). The next revolution of the wafer will show another path 402 for this same point 400. The distance between the stripes 401 and 402 is the radial velocity $V_r$ times the period of rotation and is also proportional to the radial velocity of the outlet port divided by the angular velocity of the wafer.

For large R the number of stripes is equal to the diameter of the outlet port divided by the distance between the stripes. So the number of stripes is proportional to the angular velocity $V_w$ over the radial velocity $V_r$. For any single stripe, the time associated with the outlet port being over the point of interest on the wafer is inversely proportional to the tangential velocity $V_w$. The total time that the port is over the point of interest depends on the number of stripes times the average time for each pass; i.e.:

$$\text{Total Time} \propto \frac{\omega}{V_r} \cdot \frac{1}{\omega r} = \frac{1}{V_r r}$$

Thus for large R, the radial velocity varies as 1/r to maintain constant total time and constant total megasonic energy at each point on the wafer.

As the outlet port moves toward the center of the wafer, its radial velocity increases and the number of "stripes" decreases. Also where the velocity of the outlet port is greater than the outlet port diameter divided by the period of the wafer rotation, there will be points on the wafer that are not exposed to the cleaning outlet port at all.

To ensure uniform cleaning at all points on the wafer, it is required that the rotational velocity of the wafer and the speed of the outlet port be balanced to yield an acceptable coverage for each point on the wafer.

Figure 9:
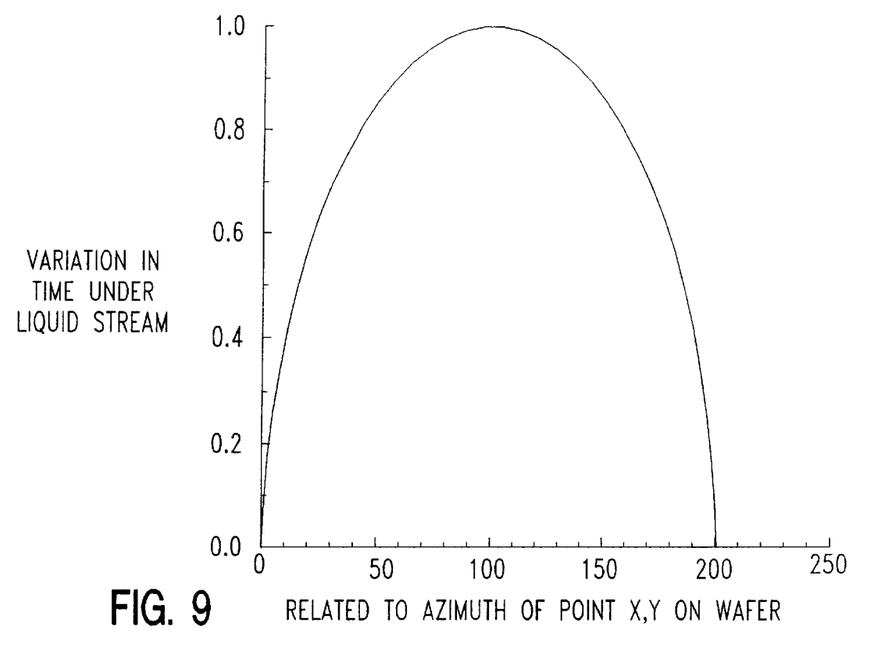
FIG. 9 is a graph which illustrates variations in time under a megasonic outlet port for a 1 stripe case.

For example, FIG. 9 shows the relative time each point on a circle of constant radius r on wafer 10 will spend under the outlet port 25 for the case when the radial speed of the outlet port 25 produces only one stripe. In this case, $$Vr = \frac{2b}{T},$$

where b is the radius of the outlet port and T is the time for one revolution of the wafer. The time under the outlet port is effectively zero where the stripe is a tangent to the outlet port. The time quickly increases up to a maximum where the maximum length stripe traverses the outlet port diameter. The time then decreases back to zero where the stripe is again tangent on the other side of the outlet port. The zero time of course means zero cleaning. The present inventors have found that this wide variation in cleaning can be reduced by increasing the number of stripes as described below.

Figure 10:
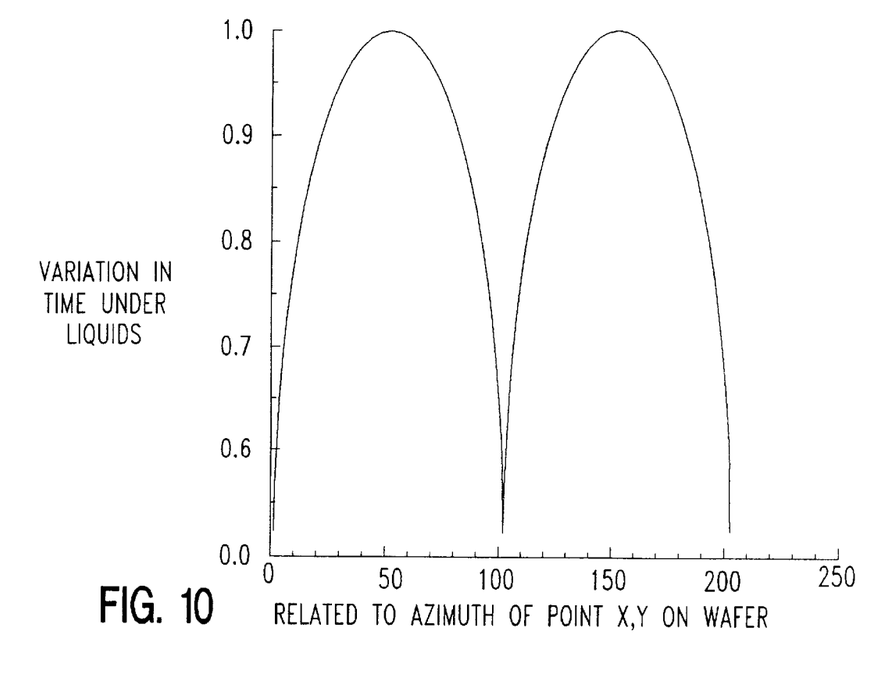
FIG. 10 is a graph which illustrates variations in time under a megasonic outlet port for a 2 stripe case.

If the rotational speed of the wafer is doubled, a point will be under the outlet port during 2 revolutions, producing 2 stripes. The relative time spent under the outlet port for the 2 stripe case is shown in FIG. 10. With two stripes the variation in time is significantly reduced. The minimum time is now up to 60% of the maximum time. The time under the outlet port now varies by less than a factor of 2, a significant improvement compared to the one stripe case.

Figure 11:
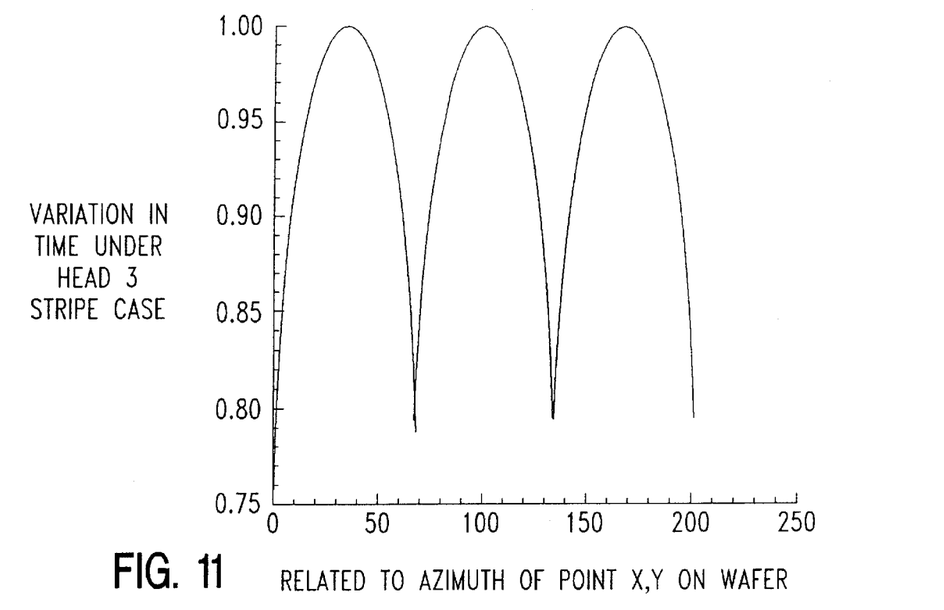
FIG. 11 is a graph which illustrates variations in time under a megasonic outlet port for a 3 stripe case.
Figure 12:
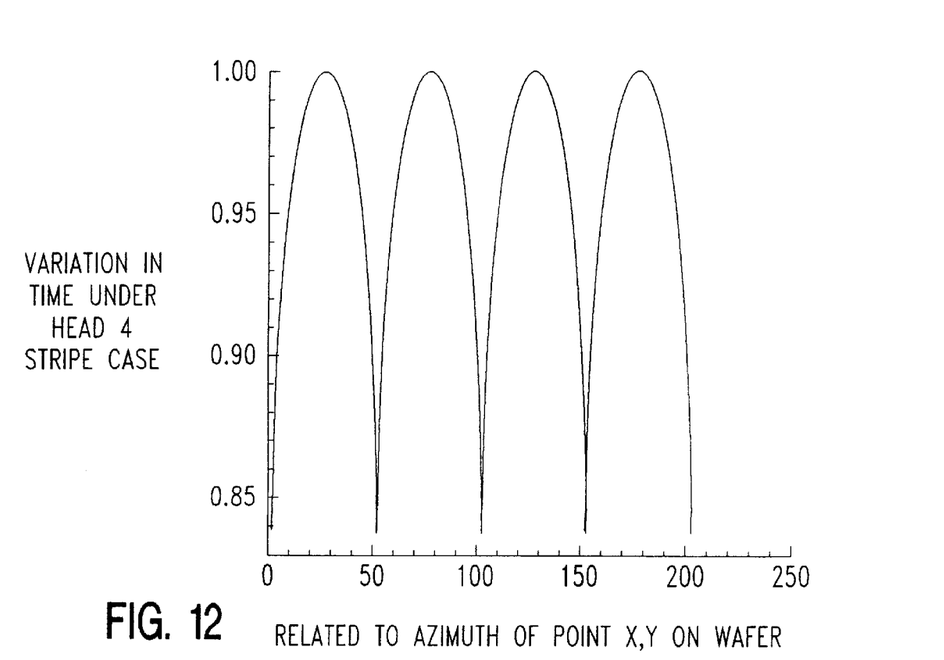
FIG. 12 is a graph which illustrates variations in time under a megasonic outlet port for a 4 stripe case.
Figure 13:
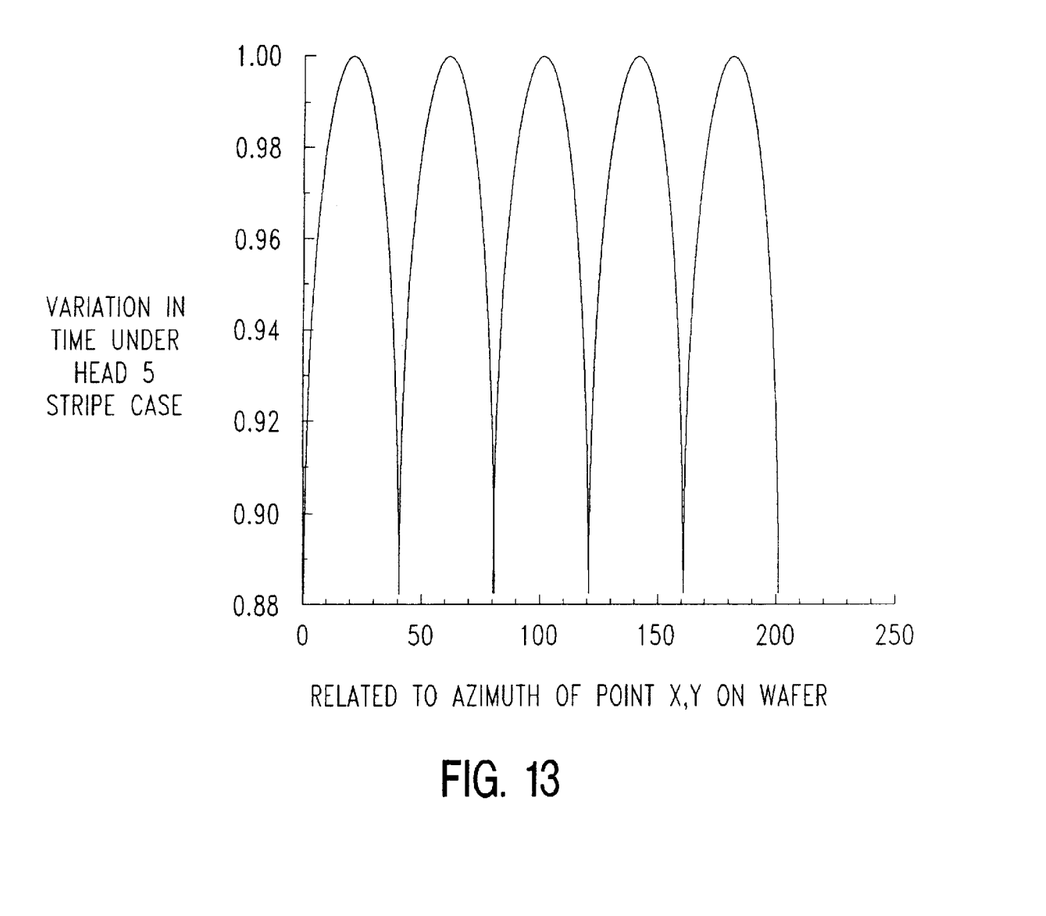
FIG. 13 is a graph which illustrates variations in time under a megasonic outlet port for a 5 stripe case.

FIGS. 11, 12, and 13 show the 3, 4, and 5 stripe cases respectively. Note that for the 3 stripe case the variation from the maximum is less than 25%. The total variation is reduced to 16% for the 4 stripe case and about 12% for the 5 stripe case. (Note that the vertical axis has a different scale on some of the plots.) According to these results, when using a system such as the Dainippon D-Sonic cleaning system, a minimum of 3 stripes should be maintained. To provide reasonably constant cleaning within reasonable tolerances. It is clear from this analysis that uniformity is significantly improved at a large radius on the wafer as the rotational speed increases. The same result can also be achieved by reducing the radial speed of the outlet port. However, adjusting the rotational speed of the wafer does not change the total time any point on the wafer is exposed to the stream but the adjusting the radial speed of the outlet port does. If the radial speed of the outlet port is adjusted the megasonic power will also need to be adjusted to maintain constant energy applied to every point on the wafer.

Figure 4D:
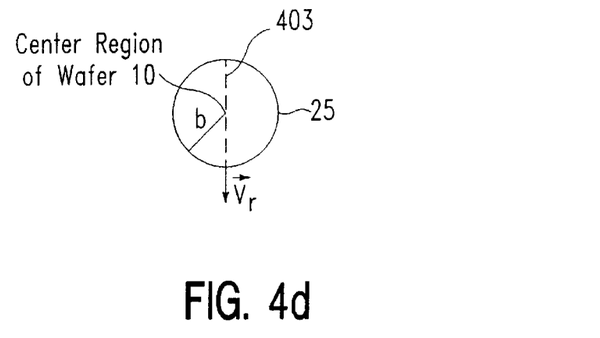

As mentioned above, these results are for large radius. The results for a point at a small radius, (for example for a radius on the order of the outlet port diameter) will differ from the large radius case because trajectories will no longer be approximated accurately by straight lines. Furthermore, a point in the center of the wafer sees the outlet port as a single vertical stripe. This is illustrated as path 403 in FIG. 4d. For path 403, the center of the wafer is in the liquid stream for a time equal to $$2\frac{b}{V_r(o)},$$

where b is the radius of the liquid stream and $V_r(o)$ is the radial velocity of the outlet port at the center of the wafer. For equal cleaning at the center of the wafer as at edge of wafer, the time the outlet port spends at the center must be equal to the time the outlet port spends over a point at the edge of the wafer. With this condition one can show that $$V_r(o) = \frac{2RV_r(R)}{b}$$

where R is the radius of wafer 10 and $V_r(R)$ is the radial velocity of the liquid stream at the edge of the wafer. Between the larger r case and the center region there is a transitional zone where both the radial speed of the outlet port $V_r$ and the tangential speed of the wafer $V_w$ are both factors.

Figure 6:
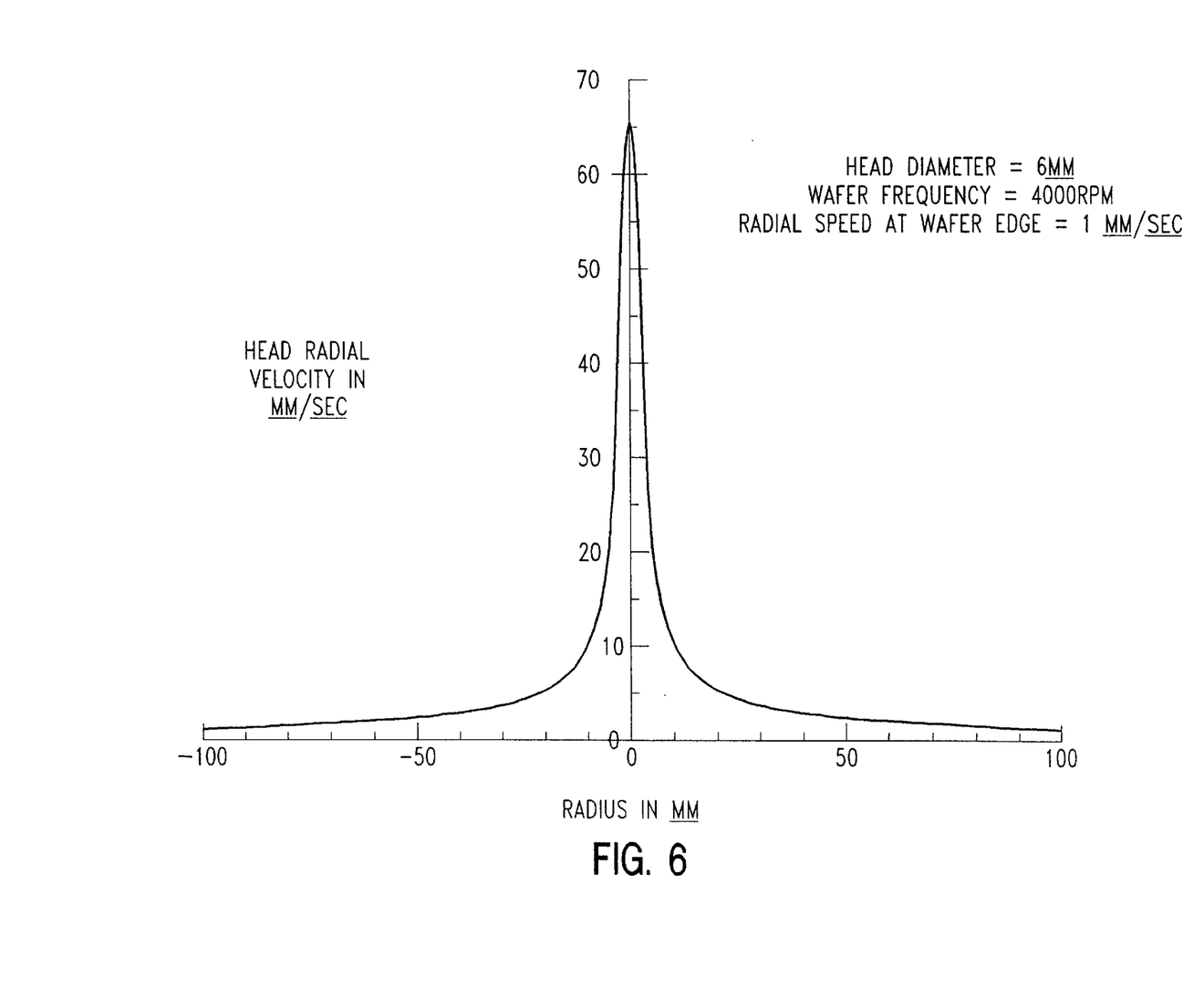
FIG. 6 is a graph showing outlet port radial velocity versus the radial distance from the outlet port for a wafer rotating at 4000 rpm according to this invention.

FIG. 6 illustrates a numerical calculation of the radial velocity as a function of radial position $V_r(r)$ of a 6 mm outlet port over a 200 mm wafer. The rotating vacuum chuck 12 was set to rotate at 4000 rpm and the radial speed at the wafer's edge was set at 1 mm/sec. A low entry speed was chosen in order to make sure that every point receives proper coverage. The radial velocity of the outlet port was calculated numerically by varying the radial velocity as a function of r to keep the dwell time constant. As shown in FIG. 6, to achieve uniform cleaning the outlet port must accelerate rapidly and decelerate rapidly within approximately a 20 mm radius of the center.

Figure 7:
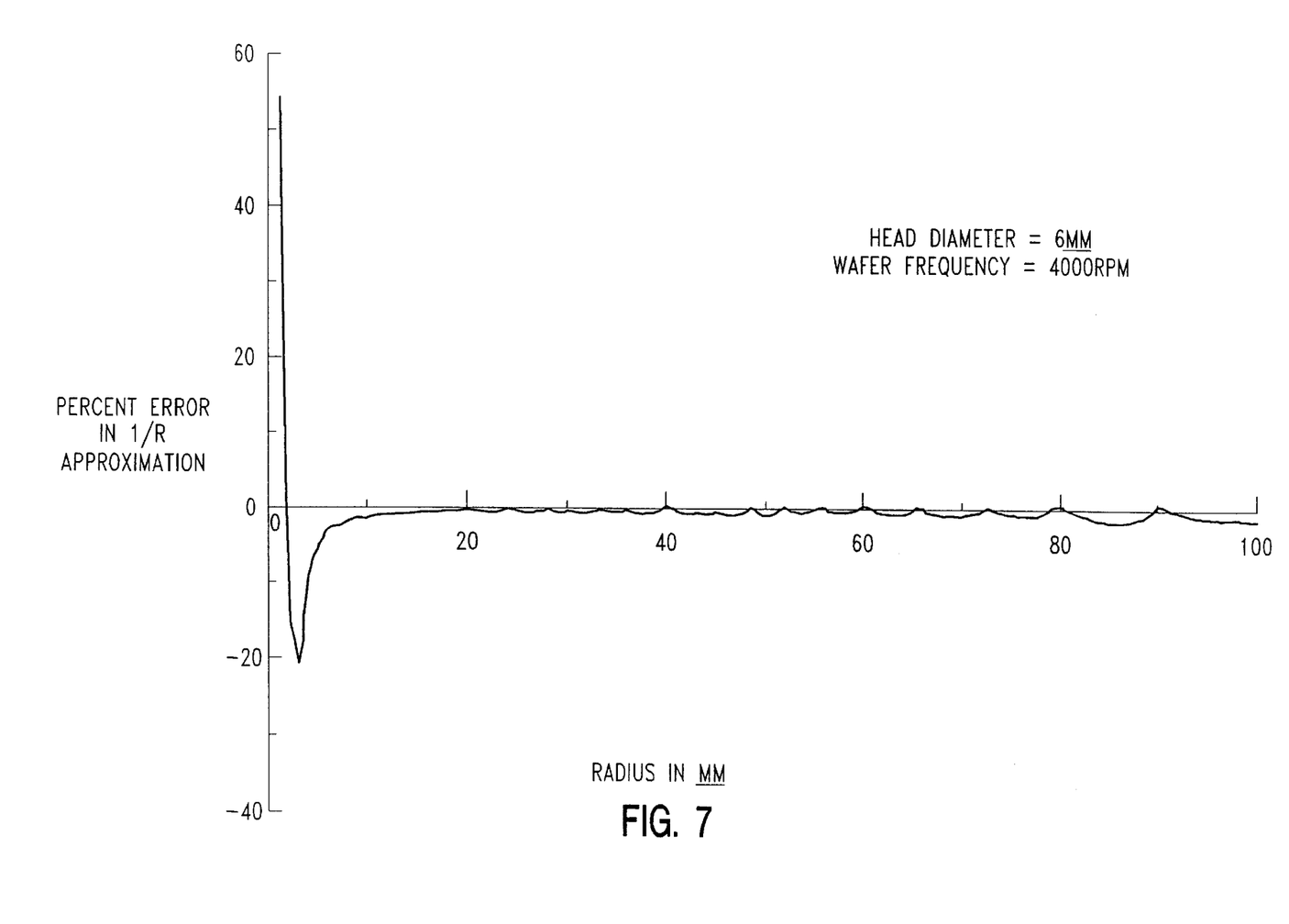
FIG. 7 is a graph illustrating the percent error in a 1/R approximation as the outlet port approaches the center.

FIG. 7 graphically illustrates the percent error in using a 1/r approximation in determining the radial velocity of the outlet port. It is seen that the 1/r approximation works well until the outlet port comes within about 10 mm of the center of the wafer.

Figure 8:
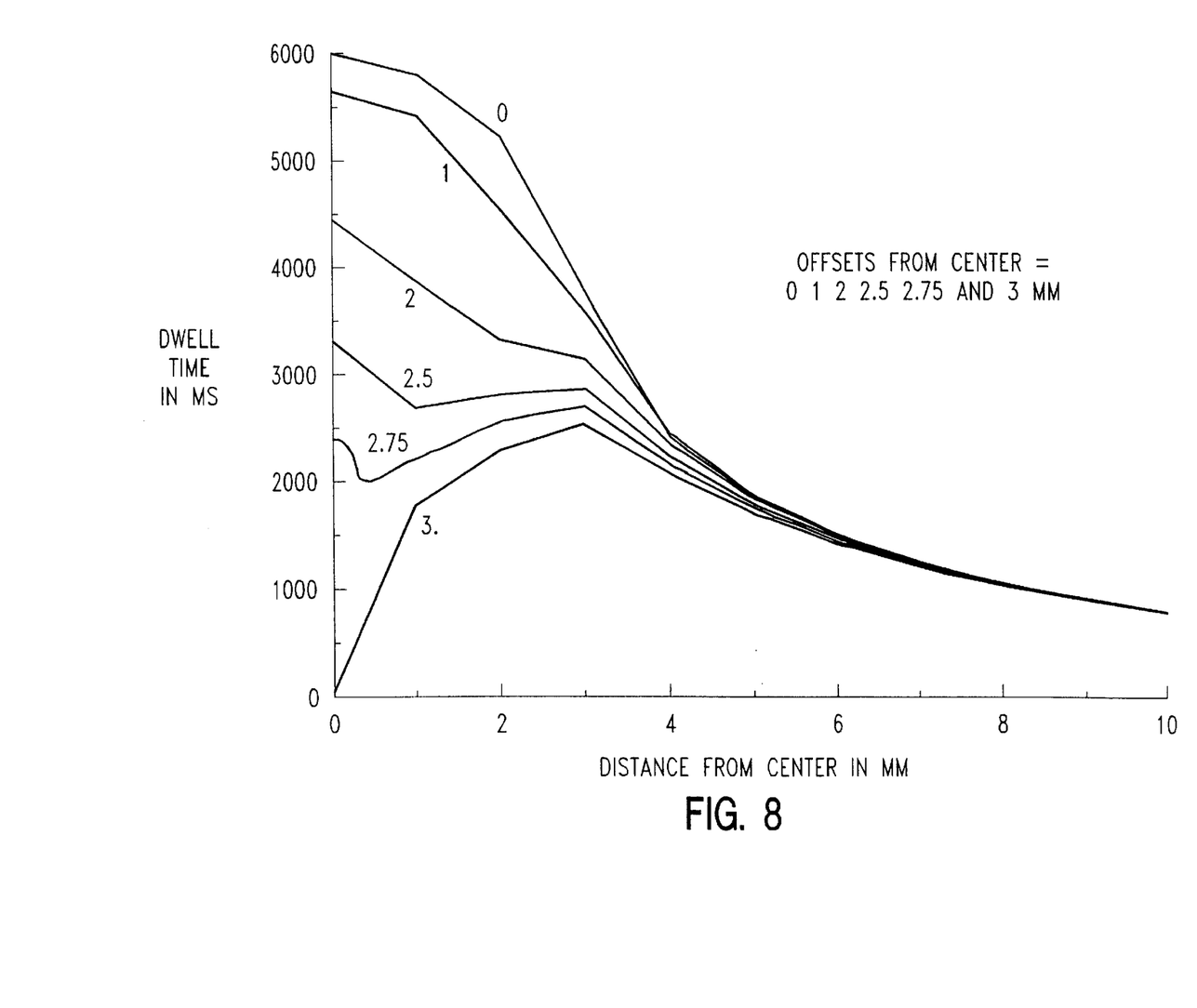
FIG. 8 is a graph showing dwell time versus distance from the center for various paths the outlet port may take parallel to the diameter of the wafer.

One way to lower the rate of acceleration necessary to achieve more uniform cleaning is to have the megasonic cleaning path 100 (FIG. 2) run in a linear path that misses the center of the wafer by an offset distance. Different offset paths were modeled having offsets from 0 to 3 mm. As shown in FIG. 8 the model shows that in the 2.5 to 2.75 mm offset cases the dwell time near the center has the least variation from the dwell time at larger radius. It is seen that this peak dwell time is reduced significantly as compared with the zero offset case, and therefore energy uniformity across the wafer is improved. Therefore, the acceleration of the outlet port can be reduced significantly by offsetting.

Alternatively, to reduce outlet port dwell time in the center region of the wafer the outlet port can travel in an oscillating manner, offsetting the megasonic path by timing the oscillations to avoid the center of the wafer. In another alternative as the outlet port approaches the center of the wafer the power of the megasonic transducer can be reduced by a factor equal to the increased dwell time.

In the embodiments so far described, the rotational speed of wafer 10 has been constant. Arm motor 34 is a DC motor with a variable drive rate which is servo controlled. A servo controlled motor, such as those used in disk drives to vary the read/write head/position, is used. Arm motor 34 drives gear 38 through shaft 32. The arm is geared such that of gear 38 causes moving arm 28 to move in a rectilinear fashion across wafer 10. Controller 20 generates a signal based on the present radius determined by sensor 36, and sends the signal to motor 34 to adjust the rate of movement of arm 28. The outlet port 25 moves across wafer 10, is changed so that each point on wafer 10 sees outlet port 25 for about the same amount of time and receives approximately the same amount of energy according to the velocity model described herein above.

Alternatively, a program to provide the desired velocity profile of outlet port movement across the wafer can be accomplished without the use of a position sensor. In this case the profile is set between fixed start and end positions.

Figure 5:
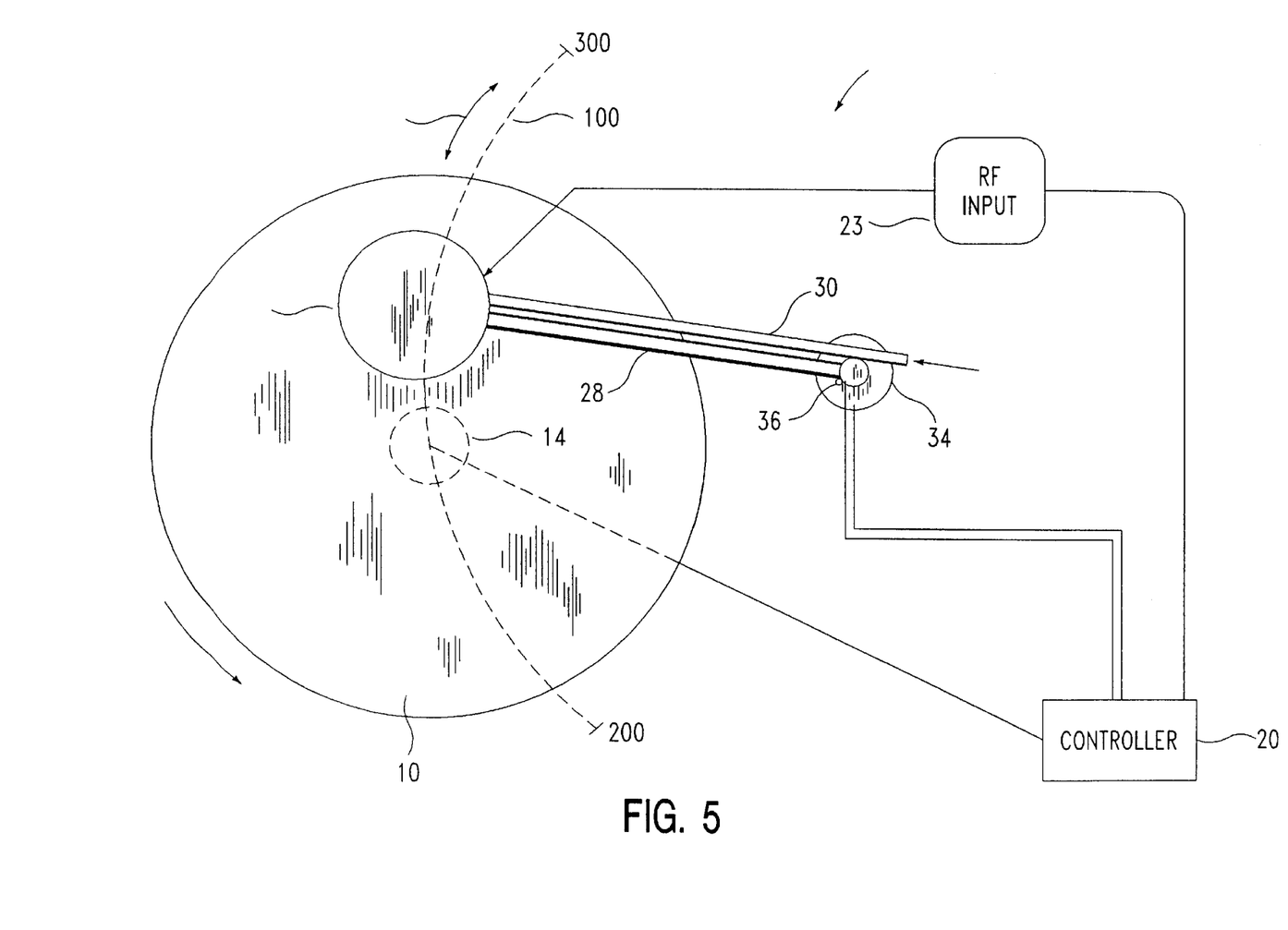
FIG. 5 is a simplified drawing of a megasonic spin-cleaning system which uses a curvilinear sweep path.

One could apply other mechanisms to achieve these results, such as cams instead of variable speed motors. Also the sweep of arm 28 need not be rectilinear. The sweep path could be a curve through the center of wafer 10 as shown in FIG. 5.

While the invention has been particularly shown and described with reference to the preferred embodiment thereof, it will be understood by those skilled in the art that various changes in form and detail may be made therein without departing from the spirit and scope of the invention. For example, the present invention may likewise be suitable for the cleaning other objects, such as, magnetic disks.

What is claimed is:

1. A method of cleaning a workpiece comprising the steps of:
    a) spinning the workpiece about an axis;
    b) directing a stream of cleaning fluid through an outlet port at the workpiece while moving the outlet port over the workpiece, the outlet port having a traverse rate across the workpiece; and
    c) varying the traverse rate so that the effect of the cleaning fluid on the workpiece is independent of the radial position of the outlet port over the workpiece, wherein the radial velocity of the outlet port is varied so that the cleaning fluid stream spends a time over all points on the wafer that is equal within a factor of about 2.

2. The method according to claim 1 wherein the cleaning fluid contains megasonic energy.

3. A method of cleaning a workpiece comprising the steps of:
    a) spinning the workpiece about an axis;
    b) directing a stream of cleaning fluid through an outlet port at the workpiece while moving the outlet port over the workpiece, the outlet port having a transverse rate across the workpiece; and
    c) varying the traverse rate so that the effect of the cleaning fluid on the workpiece is independent of the radial position of the outlet port over the workpiece;
wherein the cleaning fluid contains megasonic energy and wherein the workpiece has a center of rotation and the megasonic energy is provided at a power level, the method further comprising the step of reducing the power level as the outlet port approaches the center of rotation.

4. The method of claim 2 wherein the outlet port follows a path parallel to the diameter of the workpiece.

5. The method of claim 4 wherein the path is approximately along the diameter of the workpiece.

6. The method of claim 4 wherein the path is offset from a diameter of the workpiece.

7. The method of claim 4 wherein the path is a curvilinear path approximately along the diameter of the workpiece.

8. The method of claim 1 wherein the traverse rate of the outlet port is controlled by a computer controller.

9. The method according to claim 1 wherein the workpiece is a semiconductor wafer.

10. A method of cleaning, comprising the steps of:
    a) spinning a substrate about an axis;
    b) directing a stream of cleaning fluid through an outlet port at said substrate while providing high frequency sound energy to said stream and while moving said outlet port over said substrate, said outlet port having a traverse rate across said substrate; and
    c) varying a parameter of said outlet port or said stream of cleaning fluid so that all points on said substrate receive about the same amount of energy within a factor of two.

11. The method as recited in claim 10, wherein said parameter is velocity.

12. A method as recited in claim 10, wherein said parameter is megasonic power level.

13. The method of claim 10, wherein the spinning, workpiece has a center of rotation, the method comprising the step of reducing the megasonic power level as the outlet port approaches the center of rotation.

14. The method of claim 10, wherein said outlet port follows a path parallel to a diameter of the workpiece.

15. The method of claim 14, wherein said path is approximately along said diameter.

16. The method of claim 14, wherein said path is offset from said diameter.

17. The method of claim 10, wherein said outlet port follows a curvilinear path approximately along a diameter of the workpiece.

18. The method of claim 10, wherein the traverse rate of the outlet port is controlled by a computer controller.

19. The method according to claim 10, wherein the substrate is a semiconductor wafer.

20. A method of cleaning a workpiece comprising the steps of:
    a) spinning the workpiece about an axis;
    b) directing a stream of cleaning fluid through an outlet port at the workpiece while moving the outlet port over the workpiece, the outlet port having a traverse rate across the workpiece; and
    c) varying the traverse rate so that the effect of the cleaning fluid on the workpiece is independent of the radial position of the outlet port over the workpiece;
wherein the cleaning fluid contains megasonic energy, wherein the workpiece has a center of rotation, and wherein varying step (c) comprises increasing the traverse rate of the outlet port as the outlet port approaches the center of rotation.

* * * * *